United States Patent
Fukushi

(10) Patent No.: US 7,633,310 B2
(45) Date of Patent: Dec. 15, 2009

(54) SEMICONDUCTOR INTEGRATED CIRCUIT CAPABLE OF AUTONOMOUSLY ADJUSTING OUTPUT IMPEDANCE

(75) Inventor: Tetsuo Fukushi, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/924,627

(22) Filed: Oct. 26, 2007

(65) Prior Publication Data
US 2008/0106301 A1    May 8, 2008

(30) Foreign Application Priority Data
Nov. 2, 2006    (JP)    ............... 2006-299320

(51) Int. Cl.
*H03K 17/16*    (2006.01)
*H03K 19/003*    (2006.01)
(52) U.S. Cl. .................... 326/30; 326/32; 326/33
(58) Field of Classification Search ............. 326/26–27, 326/30, 87; 327/112
See application file for complete search history.

(56) References Cited

U.S. PATENT DOCUMENTS

| | | | | |
|---|---|---|---|---|
| 6,049,221 A | * | 4/2000 | Ishibashi et al. | 326/30 |
| 6,525,558 B2 | * | 2/2003 | Kim et al. | 326/30 |
| 6,919,738 B2 | | 7/2005 | Kushida | |
| 7,038,486 B2 | * | 5/2006 | Aoyama et al. | 326/30 |

FOREIGN PATENT DOCUMENTS

JP    3626452    12/2004

* cited by examiner

*Primary Examiner*—Anh Q Tran
(74) *Attorney, Agent, or Firm*—Young & Thompson

(57) ABSTRACT

A semiconductor integrated circuit includes an output driver, a replica driver, a replica resistor, and an impedance adjustment circuit. The output driver is configured to be capable of changing current driving capability. The replica driver is configured to be capable of changing current driving capability. The replica resistor is connected to an output of the replica driver. The impedance adjustment circuit is configured to adjust the current driving capability of the output driver and the replica driver, based on an output voltage of the replica driver. In addition, the output driver, the replica driver, the replica resistor, and the impedance adjustment circuit are mounted in an integrated circuit package.

19 Claims, 6 Drawing Sheets

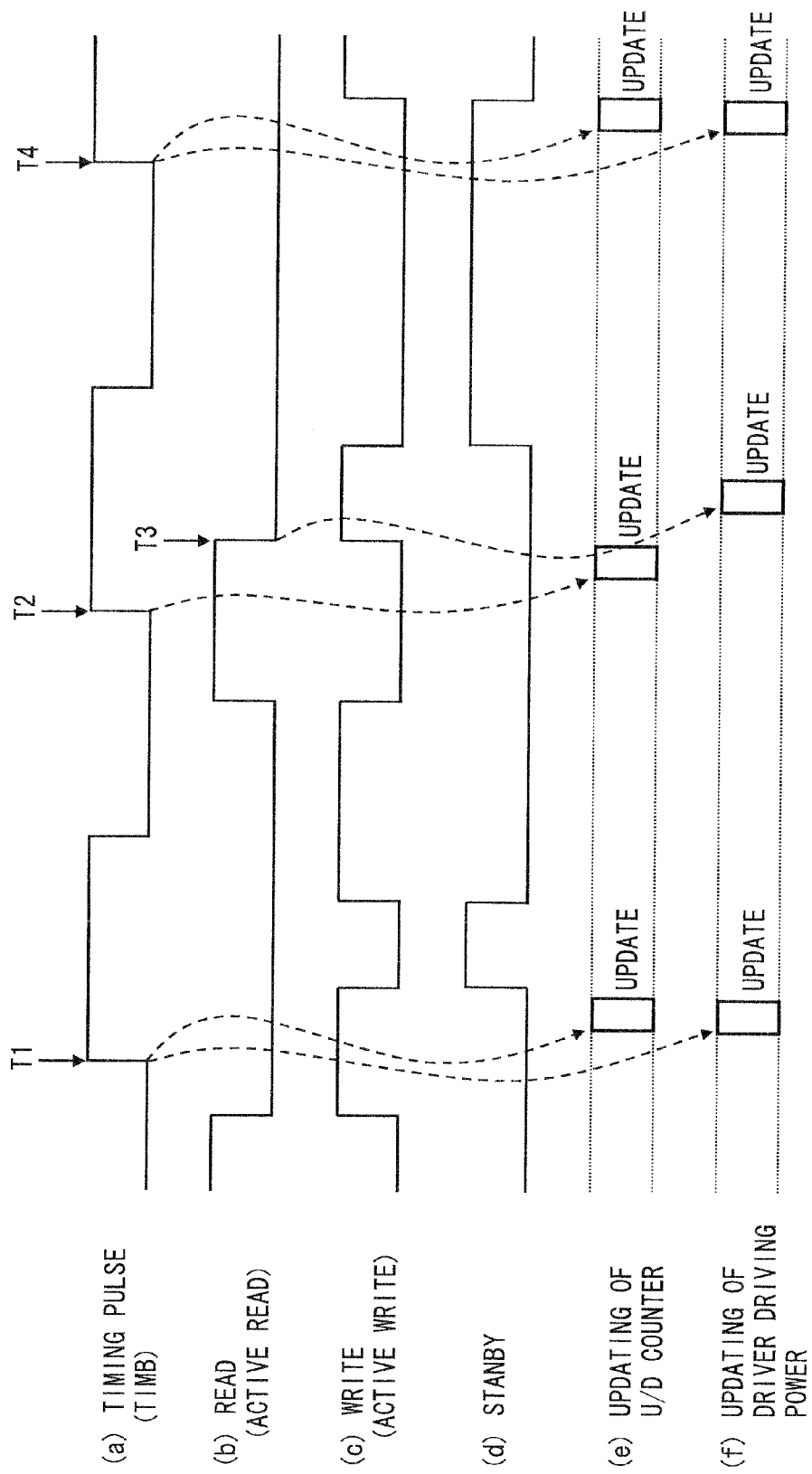

SEMICONDUCTOR INTEGRATED CIRCUIT CAPABLE OF AUTONOMOUSLY ADJUSTING OUTPUT IMPEDANCE

BACKGROUND OF THE INVENTION

1. Field of the Invention

The present invention relates to a semiconductor integrated circuit configured to be capable of autonomously adjusting output impedance.

2. Description of Related Art

When a semiconductor integrated circuit transfers data to the outside, if there exists a mismatch between the output impedance of the output driver of the semiconductor integrated circuit and the impedance of a transmission line connected to the output driver, there occurs reflection of a data signal outputted from the output driver. Generally, impedance of a transmission line has a tendency to hardly vary, but output impedance of a semiconductor integrated circuit has a tendency to easily vary according to a fluctuation of the operating voltage or temperature in the circuit. For this reason, there has been contrived an impedance adjustment circuit that can detect a fluctuation of the impedance and autonomously correct it.

The impedance adjustment circuit capable of autonomously adjusting the impedance is often used in semiconductor integrated circuits operating at a high speed, such as a SRAM (Static Random Access Memory). On the other hand, the impedance adjustment circuit is not so used in semiconductor integrated circuits in which a low power consumption operation is required, such as a DRAM (Dynamic Random Access Memory) and a pseudo-SRAM. For this reason, lowering the power consumption of the impedance adjustment circuit itself has seldom been requested. However, with the increased speed of data transmission of recent years, it becomes indispensable to perform impedance matching even in the DRAM or pseudo-SRAM in order to prevent an incorrect transmission caused by reflection of the output data signal.

The Japanese Unexamined Patent Publication No. 2003-198357 (referred to as "Patent Document 1" hereinafter) discloses a DRAM chip configured to be capable of autonomously adjusting output impedance. The memory chip disclosed in this Patent Document 1 includes an external terminal to be connected to a replica resistor for impedance matching. The memory chip disclosed in this Patent Document 1 constantly compares the impedance of the output driver with the impedance of the replica resistor connected to the external terminal, and changes the size of the output driver according to the comparing result. By this procedure, the memory chip disclosed in the Patent Document 1 adjusts the output impedance of the output driver to be matched with the impedance of the replica resistor connected to the outside of the chip. The output driver used herein is a driver provided for outputting data read from a memory cell to the outside through an I/O terminal. Moreover, in order to control the sequence of the impedance matching operations stated above, there is used an external clock inputted from the outside of the semiconductor integrated circuit.

FIG. 6 shows the main part of a DRAM chip configured to be capable of autonomously adjusting output impedance. Note that FIG. 6 is drafted by the present inventor for describing a problem which the present inventor has found. As shown in FIG. 6, a DRAM chip 7 is connected to a processor 6 through an address bus 61 and a data bus 62. In the configuration components included in the DRAM chip 7, only components related to read access processing performed by the processor 6 and components related to impedance adjustment performed with respect to the data bus 62 are shown in FIG. 6.

An address decoder 12 included in the DRAM chip 7 decodes an input address which is supplied from the address bus 61 to an address input terminal 11, and selects a word line (not shown) and a bit line (not shown) of a memory cell array 13 which are corresponding to the memory cell specified by the input address.

A sense amplifier 14, which is connected to the bit line of the memory cell array 13, amplifies data read from the memory cell array 13 and outputs the amplified data to an output driver 15.

The output driver 15, which is connected to a data output terminal 16, outputs the data read from the memory cell array 13 to the data bus 62.

The output driver 15 is configured to be capable of changing the current driving capability so that the output impedance of the output driver 15 may match with the impedance of the data bus 62 being a transmission line. As a controlling mechanism of the current driving capability of the output driver 15, the DRAM chip 7 includes replica drivers 17P and 17N, comparators 18P and 18N, U/D counters 19P and 19N, and I/O terminals 71P and 71N. These configuration components constitute the impedance adjustment circuit included in the DRAM chip 7.

The replica driver 17P is a driver circuit that is configured similarly to the pull-up side circuit of the output driver 15 including pull-up side transistors and has the same output impedance as that of the pull-up side circuit. The output of the replica driver 17P is connected to the external terminal 71P to which a replica resistor R71 is connected. The replica resistor R71 has the same impedance as the characteristic impedance of the data bus 62. The comparator 18P compares the output voltage level of the replica driver 17P with the voltage level (VDDQ/2 in FIG. 6) which has been set in advance. The U/D counter 19P is counted up or counted down according to the comparing result by the comparator 18P. Furthermore, the DRAM chip 7 is configured to change the current driving capability of the replica driver 17P and the pull-up side circuit of the output driver 15 according to a value of the U/D counter 19P. The configuration described above enables the DRAM chip 7 to achieve matching between the output impedance of the replica driver 17P and the impedance of the replica resistor R71 by converging the retained value of the U/D counter 19P.

Meanwhile, in order to adjust the output impedance of the pull-down side circuit of the output driver 15, the pull-down side of the DRAM chip 7 has configuration components symmetrical to those of the pull-up side described above.

However, the present inventor has recognized that the semiconductor integrated circuit configured to be capable of autonomously adjusting output impedance, such as the DRAM chip disclosed in the Patent Document 1 and the DRAM chip 7 shown in FIG. 6, needs to be provided with an external terminal for exclusive use to be connected to the replica resistor. Accordingly, there is a problem in that the number of terminals that should be provided in the integrated circuit package increases.

SUMMARY

In one embodiment, a semiconductor integrated circuit includes an output driver, a replica driver, a replica resistor, and an impedance adjustment circuit. The output driver is configured to be capable of changing current driving capability. The replica driver is configured to be capable of changing current driving capability. The replica resistor is connected to an output of the replica driver. The impedance adjustment circuit is configured to adjust the current driving capability of the output driver and the replica driver, based on an output voltage of the replica driver. In addition, the output driver, the replica driver, the replica resistor, and the impedance adjustment circuit are mounted in an integrated circuit package.

By virtue of the configuration described above, since it is not necessary to provide an integrated circuit package with an external terminal to be connected to a replica resistor, the increase in the number of terminals that should be formed on the integrated circuit package can be controlled.

Thus, according to the present invention, it is possible to suppress the number of terminals that should be formed on the package of the semiconductor integrated circuit configured to be capable of autonomously adjusting output impedance.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a timing chart illustrating an operation of a semiconductor integrated circuit according to an embodiment of the present invention;

DETAILED DESCRIPTION OF THE PREFERRED EMBODIMENTS

Figure 1:
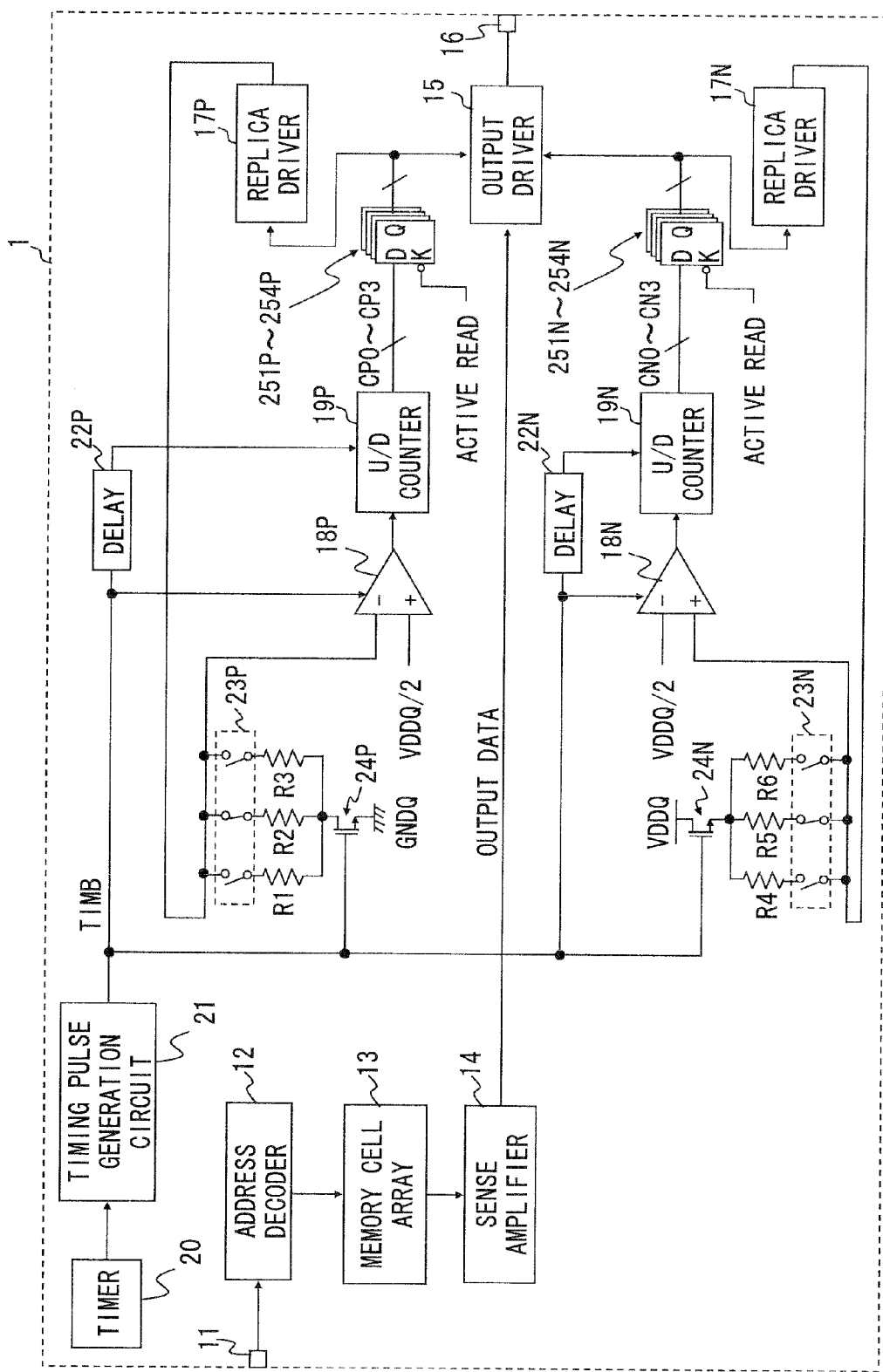
FIG. 1 is a block diagram of a semiconductor integrated circuit according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will now be described in detail with reference to the figures in the accompanying drawings. It is to be noted that the same or similar elements are denoted by the same or similar reference numerals throughout the drawings, and for the sake of brevity, duplicated description thereof will be omitted when necessary.

First Embodiment

Figure 6:
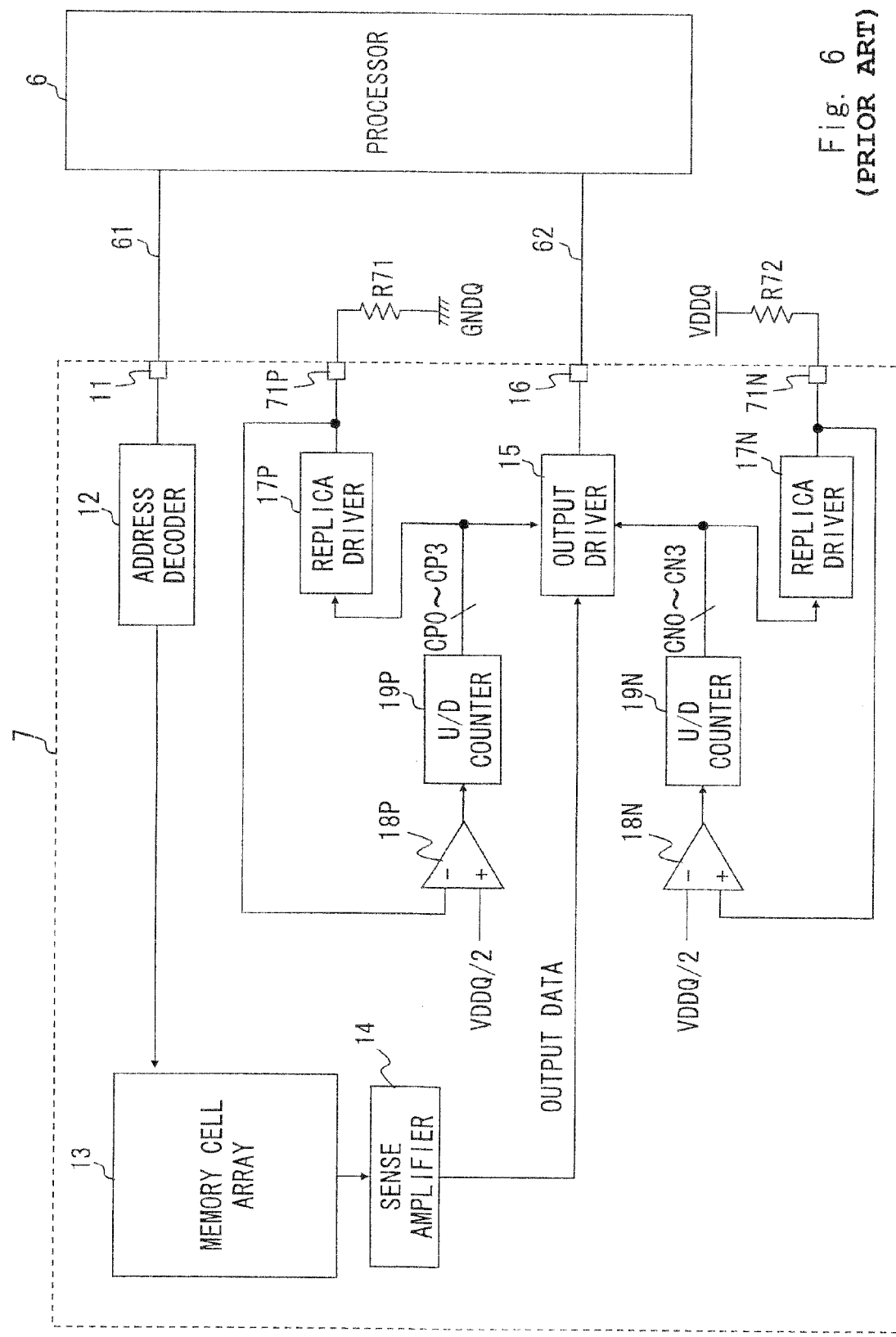
FIG. 6 is a block diagram of a semiconductor integrated circuit according to the related art.

This Embodiment describes the case of applying the present invention to a DRAM chip. FIG. 1 shows a configuration of the main part of the DRAM chip 1 according to the present Embodiment. In FIG. 1, an address input terminal 11, an address decoder 12, a memory cell array 13, a sense amplifier 14, an output driver 15, a data output terminal 16, replica drivers 17P and 17N, comparators 18P and 18N, and U/D counters 19P and 19N are the same as the configuration components included in a DRAM chip 7 shown in FIG. 6.

Figure 2:
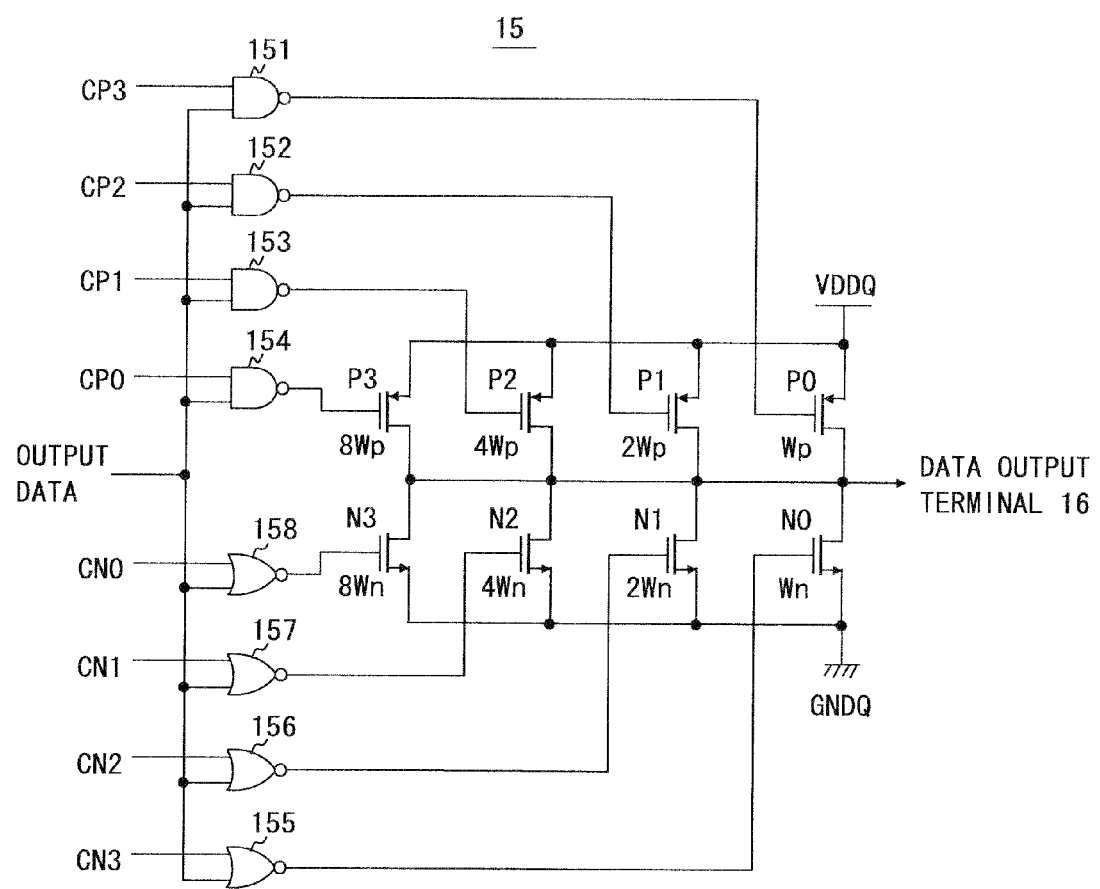
FIG. 2 is a configuration example of an output driver included in a semiconductor integrated circuit according to an embodiment of the present invention.
Figure 3A:
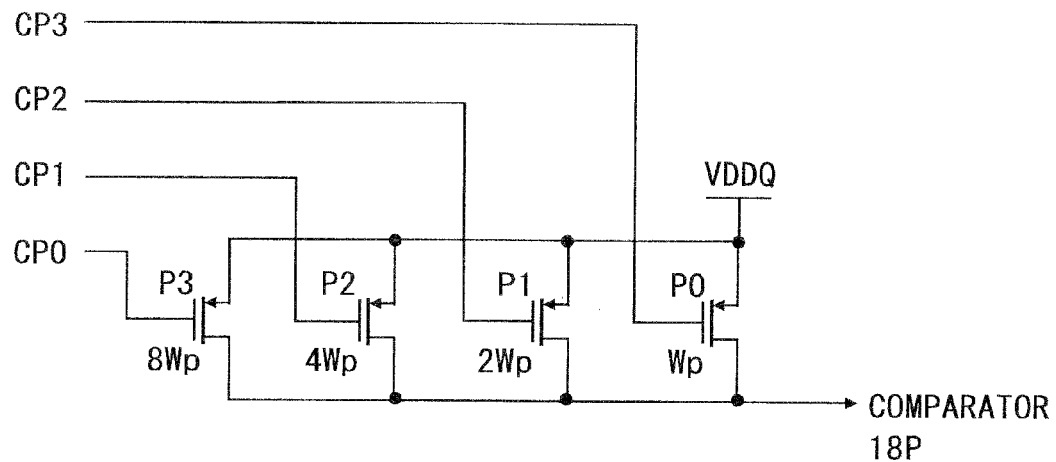
FIGS. 3A and 3B are configuration examples of a replica driver included in a semiconductor integrated circuit according to an embodiment of the present invention.
Figure 3B:
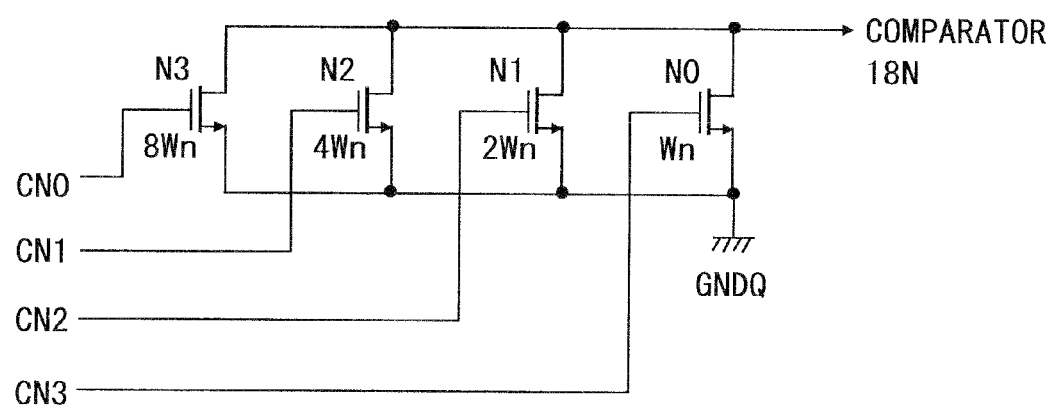

Now, an example of the configuration of the output driver 15 is shown in FIG. 2, and examples of the replica drivers 17P and 17N are shown in FIGS. 3A and 3B. In the present Embodiment, the U/D counters 19P and 19N are 4-bit counters. In other words, 4-bit values CP0 to CP3 held in the U/D counter 19P are transmitted to the pull-up side circuit of the output driver 15 and the replica driver 17P, as control signals for adjusting the current driving capability. Similarly, 4-bit values CN0 to CN3 held in the U/D counter 19N are transmitted to the pull-down side circuit of the output driver 15 and the replica driver 17N, as control signals for adjusting the current driving capability.

As shown in FIG. 2, P-channel MOS transistors P0 to P3 are a group of transistors for pull-up driving, and configured to have gate widths Wp, 2Wp, 4Wp, and 8Wp, respectively. The output impedance is adjusted by selectively turning on the transistors P0 to P3 according to the control signals CP0 to CP3. NAND circuits 151 to 154 input one of the control signals CP0 to CP3 and the output data. Operations of the transistors P0 to P3 are controlled according to the outputs of the NAND circuits 151 to 154. More described in detail, for example, when the output data and the control signal CP0 are both 1, i.e., at a high level, the output of the NAND circuit 151 becomes low level, and thereby the transistor P0 is set to the ON state.

On the other hand, N-channel MOS transistors N0 to N3 are a group of transistors for pull-down driving, and configured to have gate widths Wn, 2Wn, 4Wn, and 8Wn, respectively. The output impedance is adjusted by selectively turning on the transistors N0 to N3 according to the control signals CN0 to CN3. NOR circuits 155 to 158 input one of the control signals CN0 to CN3 and the output data. Operations of the transistors N0 to N3 are controlled according to the outputs of the NOR circuits 155 to 158. More described in detail, for example, when the output data and the control signal CN0 are both zero, i.e., at a low level, the output of the NOR circuit 155 becomes high level, and thereby the transistor N0 is set to the ON state. Since the configuration shown in FIG. 2 is merely an example, it should be understood that the concrete configuration of the output driver 15 is not limited thereto. For example, the combination of the gate widths of the P-channel MOS transistors P0 to P3 and the N-channel MOS transistors N0 to N3 is not limited to that shown in FIG. 2, and the number of transistors is not restricted to that of FIG. 2, either.

The replica driver 17P shown in FIG. 3A includes P-channel MOS transistors P0 to P3 that are configured to have the same feature as that of the transistor group included in the pull-up side circuit of the output driver 15 shown in FIG. 2, and is configured similarly to the pull-up side circuit of the output driver 15. The replica driver 17N shown in FIG. 3B includes N-channel MOS transistors N0 to N3 that are configured to have the same feature as that of the transistor group included in the pull-down side circuit of the output driver 15 shown in FIG. 2, and is configured similarly to the pull-down side circuit of the output driver 15. In addition, since the configurations shown in FIGS. 3A and 3B are merely examples, it should be understood that the concrete configurations of the replica drivers 17P and 17N are not limited thereto.

Returning to FIG. 1, a self-refresh timer 20, which is provided in the DRAM chip 1, generates a clock signal that specifies a timing of refreshing the memory cell array 13.

A timing pulse generation circuit 21 generates a pulse signal TIMB for specifying timing of impedance adjustment, by using the clock signal generated by the self-refresh timer 20. The pulse signal TIMB specifies a timing of adjusting the output impedance of the output driver 15 by the comparators 18P and 18N and the U/D counters 19P and 19N.

A delay circuit 22P delays the pulse signal TIMB generated by the timing pulse generation circuit 21 by a predetermined time, and supplies it to the U/D counter 19P. Similarly, a delay circuit 22N supplies the delayed pulse signal TIMB to the U/D counter 19N. The delay amounts of the delay circuits 22P and 22N are determined with taking the operation delay time of the comparators 18P and 18N and transistor switches 24P and 24N into consideration so that the U/D counters 19P and 19N can input the output signal in which the comparing result by the comparators 18P and 18N is reflected.

A switch group 23P is a circuit provided for changing a value of resistance of the replica resistor which is connected to the output of the replica driver 17P. With the configuration shown in FIG. 1, the switch group 23P selectively connects one of the three replica resistors R1 to R3 having different resistance values to the output of the replica driver 17P, thereby switching the value of resistance of the replica resistor. The state setting, i.e., ON or OFF state, of the switch group 23P may be performed by a mode setting from the register (not shown) after supplying power, etc. In addition, the configuration for changing the value of resistance of the replica resistor is not limited to the one shown in FIG. 1. For example, the value of resistance of the replica resistor may be selectable from four or more resistance values. It is also acceptable to adopt the configuration in which the value of resistance of the replica resistor is changed by using a variable resistor composed of a MOS transistor.

Moreover, it is also preferable to set the resistance values of the replica resistors R1 to R3 to be K times the impedance of the transmission line (for example, the data bus 62) connected to the data output terminal 16, and then corresponding to this, to set the current driving capability of the replica drivers 17P and 17N to be 1/K of the output driver. In other words, what is necessary is to set the gate width of the transistors P0 to P3 and N0 to N3 configuring the replica drivers 17P and 17N to be 1/K of the gate width of the corresponding transistor group of the output driver 15. The configuration mentioned above makes it possible to reduce the consumption current.

A switch group 23N is a circuit provided for changing a value of resistance of the replica resistor which is connected to the output of the replica driver 17N. The configuration, the operation, and the like of the switch group 23N are the same as those of the switch group 23P mentioned above.

The transistor switches 24P and 24N are composed of N-channel MOS transistors, and operate in response to the pulse signal TIMB. That is, the transistor switch 24P turns ON only during the period of the pulse signal TIMB being at a high level, and sends current to the replica driver 17P and the replica resistor R1, R2, or R3 connected to the replica driver 17P. Similarly, the transistor switch 24N also turns ON only during the period of the pulse signal TIMB being at a high level, and sends current to the replica driver 17N and the replica resistor R4, R5, or R6 connected to the replica driver 17N.

Four D latches 251P to 254P are configured to input an "active read" signal indicating that the DRAM chip 1 is in the data read operation as a clock signal, and to latch the signals CP0 to CP3 output from the U/D counter 19P when the "active read" signal is at a low level, i.e. when the data read operation is not being performed. Outputs of the D latches 251P to 254P are input into the output driver 15 and the replica driver 17P. Since the U/D counter 19P is a 4-bit counter according to the present Embodiment, there are provided the four D latches 251P to 254P. In the same way, four D latches 251N to 254N are provided at the output side of the pull-down side U/D counter 19N. The D latches 251N to 254N are configured to latch the signals CN0 to CN3 output from the U/D counter 19N when the "active read" signal is at a low level.

Then, the operation of adjusting the output impedance of the output driver 15 will now be explained with reference to the timing chart shown in FIG. 4. In the following, description will be made regarding the pull-up side of the output driver 15 as an example, and then, the pull-down side thereof operates similarly.

At the time T1 shown in FIG. 4, when the pulse signal TIMB generated by the timing pulse generation circuit 21 becomes a high level, the transistor switch 24P is set to the ON state. This makes current flow to the output of the replica driver 17P and the replica resistor (for example, the resistor R2) which is connected to the replica driver 17P through the switch group 23P. Then, the comparator 18P is activated at this timing to compare the output voltage level of the replica driver 17P (that is, the voltage level between the replica driver 17P and the replica resistor R2) and the reference voltage level (VDDQ/2). Furthermore, as shown in (e) of FIG. 4, at the timing of the pulse signal TIMB, which is delayed by the delay circuit 22P, turning to a high level, the U/D counter 19P is counted up or counted down according to the comparing result of the comparator 18P.

Moreover, as shown in (b) of FIG. 4, at the time T1, the data read operation is not being performed and the "active read" signal is at a low level. For this reason, updating of the U/D counter 19P is immediately reflected in the D latches 251P to 254P. This makes the current driving capability of the output driver 15 and the replica driver 17P change as shown in (f) of FIG. 4. The updating at the time T4 in FIG. 4 is also performed similarly.

On the other hand, at the time T2 shown in FIG. 4, in response to the pulse signal TIMB turning to a high level, operations up to the updating of the count value of the U/D counter 19P are performed according to the comparing result of the comparator 18P. However, since the data read operation is being performed at the time T2, the "active read" signal is at a high level. For this reason, reflecting the count value of the U/D counter 19P in the D latches 251P to 254P is made pending. Then, at the time T3, in response to the data read operation having been completed and the "active read" signal turning to a low level, the updated count value of the U/D counter 19P is reflected in the D latches 251P to 254P. According to this, as shown in (f) of FIG. 4, the current driving capability of the output driver 15 and the replica driver 17P is changed.

During the data read operation, there is a possibility of the data read from the memory cell array 13 is being output by the output driver 15. Therefore, in the event that the current driving capability of the output driver 15 is changed during the data read operation, there may occur a reflection of the output signal. In order to avoid such a phenomenon, according to the present Embodiment, the current driving capability of the output driver 15 is updated while the data read operation is not being performed, i.e., while the data write operation is being performed (at high level of (c) of FIG. 4) or during the standby time when neither data read operation nor write operation is performed (at high level of (d) of FIG. 4).

It is possible for the DRAM chip 1 according to the present Embodiment described above to cope with the problems of the semiconductor integrated circuit configured to be capable of autonomously adjusting output impedance according to the related art, by the following processing:

Firstly, since the semiconductor integrated circuit including an impedance adjustment circuit according to the related art needs to be provided with an external terminal for exclusive use to be connected to a replica resistor, there has been a problem that the number of terminals that should be formed on the integrated circuit package increases and the area of the print substrate on which the semiconductor integrated circuit is mounted also increases. On the other hand, the DRAM chip 1 according to the present Embodiment includes the replica resistors R1 to R6. Owing to this, the external terminal to be connected to the replica resistor becomes unnecessary, thereby suppressing the number of terminals that should be formed on the integrated circuit package and the area of the print substrate on which the semiconductor integrated circuit is mounted.

Secondly, in the semiconductor integrated circuit including an impedance adjustment circuit according to the related art, since the current always flows through a replica resistor connected to an exclusive external terminal, there has been a problem in that the amount of consumed power becomes large. On the other hand, the DRAM chip 1 according to the present Embodiment is configured to have the transistor switches 24P and 24N in a path of the current flowing through the replica resistors R1 to R6, and to make the current flow through the replica resistors R1 to R6 only when performing an adjustment of the output impedance by the on-off operation of the transistor switches 24P and 24N. Accordingly, it becomes possible to reduce the power consumption.

Thirdly, the semiconductor integrated circuit including an impedance adjustment circuit according to the related art has a problem in that, if a variation of a characteristic impedance of the transmission line occurs due to a manufacturing process variation, it becomes necessary to change the replica resistor to be connected to the external terminal to the one having a different resistance value. On the other hand, the DRAM chip 1 according to the present Embodiment is configured to include a plurality of replica resistors (R1 to R3) having different resistance values and selectively connect one of them to the output of the replica driver 17P. Owing to this configuration, by adjusting the value of resistance of the replica resistor provided in the DRAM chip 1, it is possible to negate the variation in the impedance of the transmission line generated in the manufacturing process.

Fourthly, in the semiconductor integrated circuit including an impedance adjustment circuit according to the related art, the current driving capability of the output driver is changed in synchronization with a clock signal input from the outside. Therefore, there has been a problem that an impedance adjustment cannot be correctly performed in the event that the supply of the external clock is stopped. On the other hand, the DRAM chip 1 according to the present Embodiment performs an adjustment of the output impedance of the output driver 15 in synchronization with a clock signal generated in the DRAM chip 1, such as the self-refresh timer 20. By virtue of this function, it is possible to stably continue the adjustment operation of the output impedance even when the supply of the external clock is stopped.

In addition to the above, a semiconductor integrated circuit including only a part of the configuration components of the DRAM chip 1 described above may also be one of the Embodiments of the present invention. For example, the following modified examples are included in the Embodiments of the present invention: a modified example in which it is not performed to select a resistance value of the replica resistor by the switch groups 23P and 23N; a modified example in which it is not performed to intermittently turn on and off the current path of the replica resistor by the transistor switches 24P and 24N; and a modified example in which it is performed to adjust the current driving capability of the output driver 15 in synchronization with an external clock signal that is input into the external terminal.

Moreover, although the configuration in which only one output driver 15 is included is shown in FIG. 1 for facilitating the explanation, it should be understood that the DRAM chip 1 includes a plurality of output drivers 15 to be corresponding to the word width of the memory cell array or the data bus width with respect to the processor. Furthermore, the DRAM chip 1 may further include the output driver 15 for outputting a control signal, such as a WAIT signal, to the processor which accesses the DRAM chip 1.

Moreover, as to the bit number of the U/D counters 19P and 19N, the number mentioned in the above Embodiment is merely an example. The numbers of transistors included in the output driver 15 and the replica drivers 17P and 17N mentioned above are also merely examples. In other words, although the DRAM chip 1 of the present Embodiment can adjust the current driving capability of the output driver at 16 levels at the maximum, other number as the adjustment level may also be acceptable.

Further, the DRAM chip 1 described above stops the current which flows through the replica resistors R1 to R6, by arranging the transistor switches 24P and 24N at the positions shown in FIG. 1. However, the arrangement positions of the transistor switches 24P and 24N are not limited to those shown in FIG. 1, and other positions may also be acceptable as long as they are in a path of the current flowing through the replica resistors R1 to R6.

Second Embodiment

Figure 5:
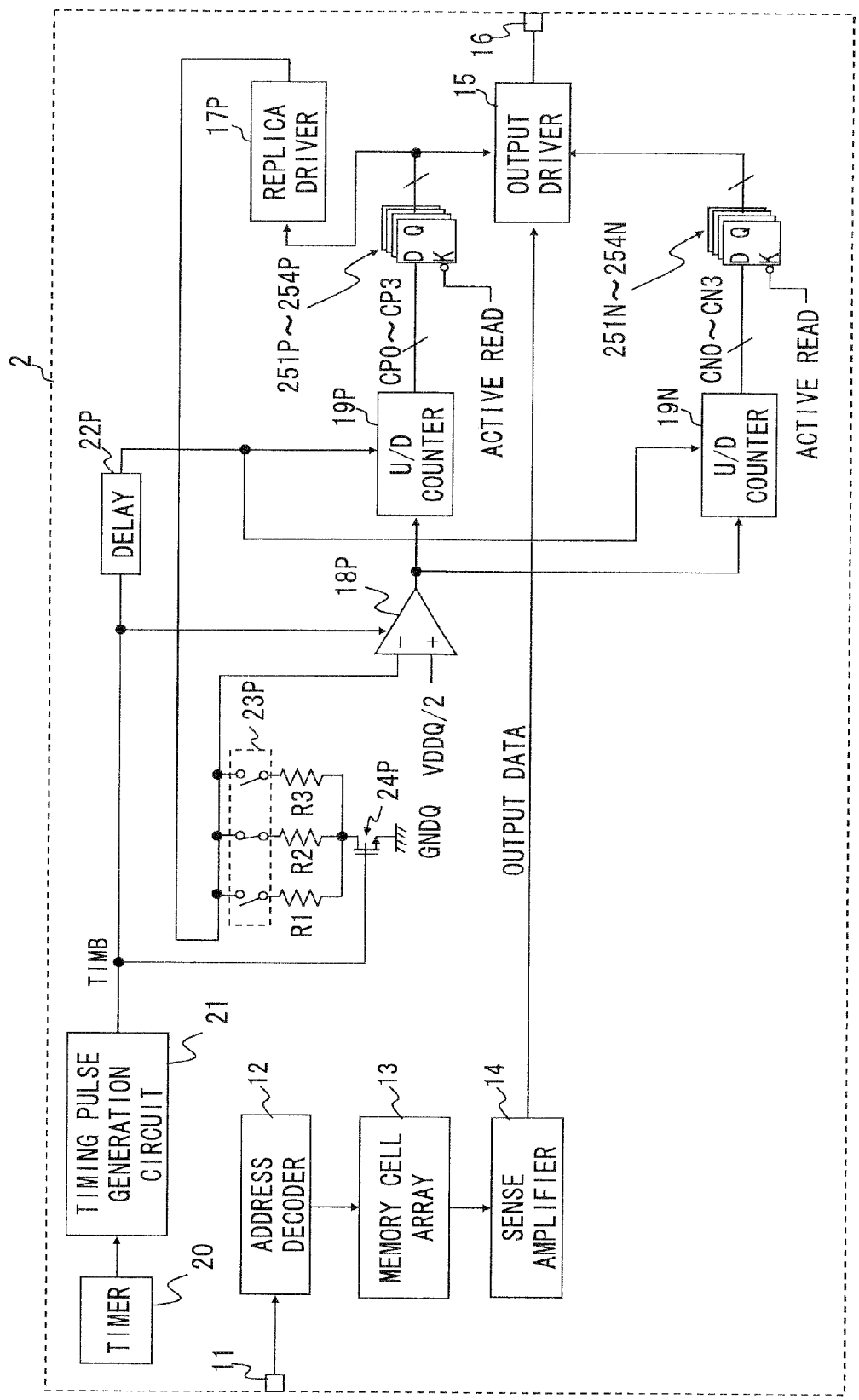
FIG. 5 is a block diagram of a semiconductor integrated circuit according to an embodiment of the present invention.

The configuration of a DRAM chip 2 according to the present Embodiment is shown in FIG. 5. The DRAM chip 2 has a configuration made by leaving out the replica driver 17N, the comparator 18N, the delay circuit 22N, the switch group 23N, the transistor switch 24N, and the replica resistors R4 to R6 from the configuration of the DRAM chip 1 according to the first embodiment. The DRAM chip 2 performs an adjustment of the current driving capability at the pull-down side of the output driver 15 by using a comparison result of the comparator 18P at the pull-up side. If the ratio between the current driving capability of the pull-up side transistors P0 to P3 and the current driving capability of the pull-down side transistors N0 to N3 of the output driver 15 is already known, it is possible to perform an output impedance adjustment including the pull-down side circuit of the output driver 15 by applying the configuration shown in FIG. 5. By virtue of the configuration described above, reducing the circuit size and the power consumption required for impedance adjustment of the output driver 15 can be achieved. In addition, in contrast to the configuration of FIG. 5, it is also acceptable to omit the circuit at the pull-up side.

While the above Embodiments 1 and 2 describe the case of applying the present invention to the DRAM chip, the applicable range of the present invention is not restricted thereto. For example, the present invention may also be applicable to other semiconductor integrated circuit including a pseudo-SRAM chip.

Furthermore, it is apparent that the present invention is not limited to the above embodiments, but may be modified and changed without departing from the scope and spirit of the invention.

What is claimed is:

1. A semiconductor integrated circuit comprising:
   an output driver configured to be capable of changing current driving capability;
   a replica driver configured to be capable of changing current driving capability;
   a replica resistor to be connected to an output of the replica driver; and
   an impedance adjustment circuit configured to adjust the current driving capability of the output driver and the replica driver, based on an output voltage of the replica driver,
   wherein the output driver, the replica driver, the replica resistor, and the impedance adjustment circuit are mounted in an integrated circuit package,
   wherein the replica resistor is free of a terminal that is i) exclusive to the replica resistor and ii) connected to an element external to the integrated circuit package, and
   wherein the replica driver is free of a connection to any external replica resistor external to the integrated circuit package via a terminal for varying the current driving capability of the output driver.

2. The semiconductor integrated circuit according to claim 1, further comprising:
   an internal clock generation circuit mounted in the integrated circuit package,
   wherein a timing of adjusting the current driving capability of the output driver and the replica driver by the impedance adjustment circuit is determined based on a clock signal generated by the internal clock generation circuit.

3. The semiconductor integrated circuit according to claim 1, further comprising:
   a switch disposed in a current path of a current flowing through the replica resistor, the switch configured to connect the current path intermittently according to a period of adjusting the current driving capability of the output driver by the impedance adjustment circuit.

4. The semiconductor integrated circuit according to claim 2, further comprising:
   a memory cell array mounted in the integrated circuit package,
   wherein the internal clock generation circuit is a self-refresh timer that specifies a timing of performing a self-refresh operation of the memory cell array.

5. The semiconductor integrated circuit according to claim 1, wherein a resistance value of the replica resistor is variable.

6. The semiconductor integrated circuit according to claim 1, further comprising:
   a plurality of replica resistors each having a different resistance value; and
   a selector configured to selectively connect the plurality of replica resistors to the output of the replica driver.

7. The semiconductor integrated circuit according to claim 1, wherein,
   each of the output driver and the replica driver includes transistors connected in parallel,
   the impedance adjustment circuit includes a comparator configured to compare an output voltage of the replica driver with a reference voltage, and a counter configured to be counted up or counted down according to a comparing result by the comparator, and
   the impedance adjustment circuit changes the current driving capability of the output driver and the replica driver by controlling on and off of each of the transistors according to a count value of the counter.

8. The semiconductor integrated circuit according to claim 7, further comprising:
   a latch circuit disposed in a connection path connecting the counter to the output driver and the replica driver, the latch circuit configured to latch a new count value of the counter during a period when the output driver is not activated, and to output a newly latched count value to the output driver and the replica driver, based on an activation signal that specifies a period when the output driver is activated.

9. The semiconductor integrated circuit according to claim 1, wherein,
   the output driver includes a pull-up side circuit for pull-up driving and a pull-down side circuit for pull-down driving,
   the replica driver has a substantially same configuration as that of either one of the pull-up side circuit and the pull-down side circuit, and
   the impedance adjustment circuit adjusts the current driving capability of the pull-up side circuit and the pull-down side circuit of the output driver, based on the output voltage of the replica driver.

10. The semiconductor integrated circuit according to claim 1, wherein,
    the output driver, the replica driver, the replica resistor, and the impedance adjustment circuit are mounted in a semiconductor chip.

11. The semiconductor integrated circuit according to claim 1, wherein,
    the current driving capability of the replica driver is set to be 1/K times that of the output driver, K being a number greater than 1, and
    a resistance value of the replica resistor is set to be K times impedance of a transmission line connected to an output terminal of the output driver.

12. A semiconductor integrated circuit comprising:
    an output driver, connectable to a data transmission line, and having a changing current driving capability such that an output impedance of the output driver is matchable to an impedance of the data transmission line;
    a replica driver configured to be capable of changing current driving capability;
    a replica resistor unit connected to an output of the replica driver; and
    an impedance adjustment circuit configured to adjust the current driving capability of the output driver and the replica driver, based on an output voltage of the replica driver,
    wherein the replica resistor unit applies a variable resistance to a current through the replica resistor unit,
    wherein the output driver, the replica driver, the replica resistor unit, and the impedance adjustment circuit are mounted in an integrated circuit package,
    wherein the replica resistor is free of a terminal that is i) exclusive to the replica resistor and ii) connected to an element external to the integrated circuit package, and
    wherein the integrated circuit package is free of a terminal connecting the replica resistor any external replica resistor external to the integrated circuit package.

13. The semiconductor integrated circuit according to claim 12, wherein,
    the output driver includes a pull-up side circuit for pull-up driving and a pull-down side circuit for pull-down driving,
    the replica driver has a substantially same configuration as that of either one of the pull-up side circuit and the pull-down side circuit, and the impedance adjustment circuit adjusts the current driving capability of the pull-up side circuit and the pull-down side circuit of the output driver, based on the output voltage of the replica driver.

14. The semiconductor integrated circuit according to claim 12, wherein,
the output driver, the replica driver, the replica resistor unit, and the impedance adjustment circuit are mounted in a semiconductor chip.

15. The semiconductor integrated circuit according to claim 12, further comprising:
a transistor switch, external to said replica resistor unit, in a path of current flow through the replica driver and the replica resistor unit,
wherein the transistor switch is configured to allow the current through the replica resistor only upon an adjustment of the output impedance.

16. The semiconductor integrated circuit according to claim 15, further comprising:
a self-refresh timer in the integrated circuit package and connected to the transistor switch, configured to generate a periodic clock signal,
wherein the adjustment of the output impedance occurs in synchronization with the clock signal.

17. The semiconductor integrated circuit according to claim 12, wherein the replica resistor unit comprises a variable resistor.

18. The semiconductor integrated circuit according to claim 12, wherein the replica resistor unit comprises a plurality of resistors and a switch group configured to selectively connect one of the plurality of resistors to the current through the replica resistor unit, each of the plurality of resistors having a different resistance value.

19. A semiconductor integrated circuit comprising:
an output driver configured to be capable of changing current driving capability;
a replica driver configured to be capable of changing current driving capability;
a replica resistor to be connected to an output of the replica driver;
an impedance adjustment circuit configured to adjust the current driving capability of the output driver and the replica driver, based on an output voltage of the replica driver;
an internal clock generation circuit mounted in the integrated circuit package; and
a memory cell array mounted in the integrated circuit package,
wherein the output driver, the replica driver, the replica resistor, and the impedance adjustment circuit are mounted in an integrated circuit package,
wherein a timing of adjusting the current driving capability of the output driver and the replica driver by the impedance adjustment circuit is determined based on a clock signal generated by the internal clock generation circuit, and
wherein the internal clock generation circuit is a self-refresh timer that specifies a timing of performing a self-refresh operation of the memory cell array.

* * * * *